(12) United States Patent
Arimura et al.

(10) Patent No.: US 10,842,056 B2
(45) Date of Patent: Nov. 17, 2020

(54) COOLING DEVICE

(71) Applicant: DENSO CORPORATION, Kariya, Aichi-pref. (JP)

(72) Inventors: Seikoh Arimura, Kariya (JP); Takashi Masuzawa, Kariya (JP); Hitoshi Yoshimura, Kariya (JP); Hiroshi Taki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/707,199

(22) Filed: Dec. 9, 2019

(65) Prior Publication Data

US 2020/0120838 A1 Apr. 16, 2020

Related U.S. Application Data

(63) Continuation of application No. PCT/JP2018/021749, filed on Jun. 6, 2018.

(30) Foreign Application Priority Data

Jun. 9, 2017 (JP) ................................. 2017-114354

(51) Int. Cl.
*H05K 7/20* (2006.01)
(52) U.S. Cl.
CPC ..... *H05K 7/20927* (2013.01); *H05K 7/20945* (2013.01)
(58) Field of Classification Search
None
See application file for complete search history.

(56) References Cited

U.S. PATENT DOCUMENTS

| | | | |
|---|---|---|---|
| 6,925,364 B1 * | 8/2005 | Huberman | G05D 23/1923 700/121 |
| 10,184,699 B2 * | 1/2019 | Shedd | F25B 23/006 |
| 2011/0194256 A1 * | 8/2011 | De Rijck | H01L 23/34 361/717 |

FOREIGN PATENT DOCUMENTS

| | | |
|---|---|---|
| JP | 2010-147111 A | 7/2010 |
| JP | 2012-099694 A | 5/2012 |
| JP | 2013-089924 A | 5/2013 |

OTHER PUBLICATIONS

Aug. 7, 2018 International Search Report issued in International Patent Application No. PCT/JP2018/021749.

* cited by examiner

*Primary Examiner* — Mohammad Ali
*Assistant Examiner* — Joshua T Sanders
(74) *Attorney, Agent, or Firm* — Oliff PLC

(57) ABSTRACT

A cooling device has a cooler, a circulator, a semiconductor temperature detection unit, a refrigerant temperature detection unit, an output acquisition unit, and a flow velocity control unit. An output area of a power converter is divided into a first output area equal to and smaller than a threshold and a second output area exceeding the threshold. The flow velocity control unit controls, in the first output area, the flow velocity of the refrigerant to be maintained within a range where the refrigerant in the heat receiving portion is kept in a non-boiling state; and controls, in the second output area, the flow velocity to be maintained within a range where the refrigerant is in the non-boiling state or a nucleate boiling state. The flow velocity in the second output area is equal to or greater than an upper limit value of the flow velocity in the first output area.

6 Claims, 5 Drawing Sheets

COOLING DEVICE

CROSS-REFERENCE TO RELATED APPLICATION

The present application is a continuation application of International Application No. PCT/JP2018/021749, filed Jun. 6, 2018, which claims priority to Japanese Patent Application No. 2017-114354 filed Jun. 9, 2017. The contents of these applications are incorporated herein by reference in their entirety.

BACKGROUND

Technical Field

The present disclosure relates to a cooling device including a cooler to circulate a refrigerant.

Background Art

In the prior art, there is a boiling cooling device that cools a semiconductor module by boiling cooling. The boiling cooling device includes a condenser that condenses the vapor of a refrigerant liquid.

SUMMARY

In the present disclosure, provided is a cooling device as the following. The cooling device includes: a cooler, a circulator, a refrigerant temperature detection unit, an output acquisition unit, and a flow velocity control unit. When an output area of the power converter is divided into a first output area equal to and lower than a predetermined threshold and a second output area exceeding the threshold, the flow velocity control unit is configured to: control, in the first output area, the flow velocity of the refrigerant to be maintained within a range where the refrigerant in the heat receiving portion is kept in a non-boiling state; and control, in the second output area, the flow velocity of the refrigerant to be maintained within a range where the refrigerant in the heat receiving portion is in the non-boiling state or a nucleate boiling state, the flow velocity of the refrigerant in the second output area being equal to or greater than an upper limit value of the flow velocity of the refrigerant in the first output area.

BRIEF DESCRIPTION OF THE DRAWINGS

The foregoing and other objects, features, and advantages of the present disclosure will be more clarified by the following detailed descriptions with reference to the accompanying drawings. The drawings are as follows.

DETAILED DESCRIPTION OF THE PREFERRED EMBODIMENTS

There are power conversion devices that are configured to cool a semiconductor module using a liquid refrigerant such as water. In such a power conversion device, when the amount of heat generation in the semiconductor module becomes large and degree of superheating increases, the refrigerant boils. The degree of superheating means a difference between the temperature of a heat transfer surface to the refrigerant and the saturation temperature of the refrigerant. Boiling of the refrigerant in a nucleate boiling region is preferred because of improvement in the heat transfer coefficient. However, when the degree of superheating further increases and the refrigerant passes through a transition boiling region and shifts to a film boiling region, the refrigerant on the heat transfer surface will dry out to block a heat transfer path. This prevents cooling of the semiconductor module.

To avoid such an event, the flow velocity of the refrigerant may be sufficiently enhanced for a thermal design with a margin so that the semiconductor module can be cooled by liquid phase cooling even in a state where the amount of heat generation in the semiconductor module becomes extremely great. However, making a thermal design with a margin allowing for the amount of heat generation at the time of instantaneous output, for example, means that excessive cooling performance is provided for cooling of the semiconductor module during steady output.

In addition, as described above, the heat transfer coefficient becomes high to improve the cooling performance in the nucleate boiling region of the refrigerant. Therefore, the cooling of the semiconductor module using the nucleate boiling state as appropriate is effective. PTL 1 discloses a boiling cooling device that cools a semiconductor module by boiling cooling.

[PTL 1] JP 2013-89924 A

The boiling cooling device disclosed in PTL 1 includes a condenser that condenses the vapor of a refrigerant liquid. That is, the boiling cooling device needs to return the vapor generated by boiling the refrigerant liquid to the liquid phase, and the boiling cooling device includes the condenser for that purpose. This results in upsizing of the cooling device.

Further, in the design for steadily performing boiling cooling, there arises the need for sustaining boiling. This causes a problem of complicated control for meeting this need.

An object of the present disclosure is to provide a cooling device that allows downsizing and simplification of the device, and achieves easy control and improvement in cooling efficiency.

One aspect of the present disclosure is a cooling device that includes: a cooler in which a liquid refrigerant for cooling a power semiconductor element of a power converter is circulatable, the cooler including a heat receiving portion that receives heat from the power semiconductor element; a circulator that circulates the refrigerant in the cooler; a semiconductor temperature detection unit that detects a temperature of the power semiconductor element; a refrigerant temperature detection unit that detects a temperature of a part of the refrigerant, the part of the refrigerant flowing upstream of the heat receiving portion; an output acquisition unit that acquires an output of the power converter; and a flow velocity control unit that controls a flow velocity of the refrigerant in the cooler based on a detected semiconductor temperature that is the temperature of the semiconductor element detected by the semiconductor temperature detection unit, a detected refrigerant temperature that is the temperature of the part of the refrigerant detected by the refrigerant temperature detection unit, and a value of the output of the power converter acquired by the output acquisition unit, wherein when an output area of the power converter is divided into a first output area equal to and lower than a predetermined threshold and a second output area exceeding the threshold, the flow velocity control unit is configured to: control, in the first output area, the flow velocity of the refrigerant to be maintained within a range where the refrigerant in the heat receiving portion is kept in a non-boiling state; and control, in the second output area, the flow velocity of the refrigerant to be maintained within a range where the refrigerant in the heat receiving portion is in the non-boiling state or a nucleate boiling state, the flow velocity of the refrigerant in the second output area being equal to or greater than an upper limit value of the flow velocity of the refrigerant in the first output area.

In the cooling device, the flow velocity control unit controls the flow amount of the refrigerant, dividing the output area of the power converter into the first output area and the second output area as described above. Specifically, the flow velocity control unit controls the flow amount of the refrigerant, dividing the output area into the first output area where the amount of heat generation in the power semiconductor element is relatively small and the second output area where the amount of heat generation in the power semiconductor element is relatively large. Accordingly, the power semiconductor element can be cooled by liquid phase cooling under simple control in the first output area, and can be efficiently cooled by the effective use of boiling cooling in the second output area.

The flow velocity of the refrigerant in the second output area is set to be equal to or greater than the upper limit value of the flow velocity of the refrigerant in the first output area. This allows sufficient cooling of the power semiconductor element in the second output area without excessive cooling performance in the first output area.

In the second output area, the flow velocity control unit controls the flow velocity of the refrigerant within the range where the refrigerant is in the non-boiling state or the nucleate boiling state. This makes it possible to use boiling cooling in the nucleate boiling region where heat flux from the power semiconductor element to the refrigerant tends to be large in the second output area.

Furthermore, even if the refrigerant comes to the boil, the refrigerant is in the nucleate boiling state and is circulated by the circulator, and it is thus easy to maintain a sub-cooled boiling state. In that state, the air bubbles generated by boiling are cooled and burst from the periphery by the refrigerant flowing in the cooler. Therefore, there is no need to provide a condenser, and the device can be downsized and simplified.

According to the mode described above, it is possible to provide a cooling device that allows downsizing and simplification of the device and achieves easy control and improvement in cooling efficiency.

First Embodiment

Embodiments related to a cooling device will be described with reference to FIGS. 1 to 5.

Figure 1:
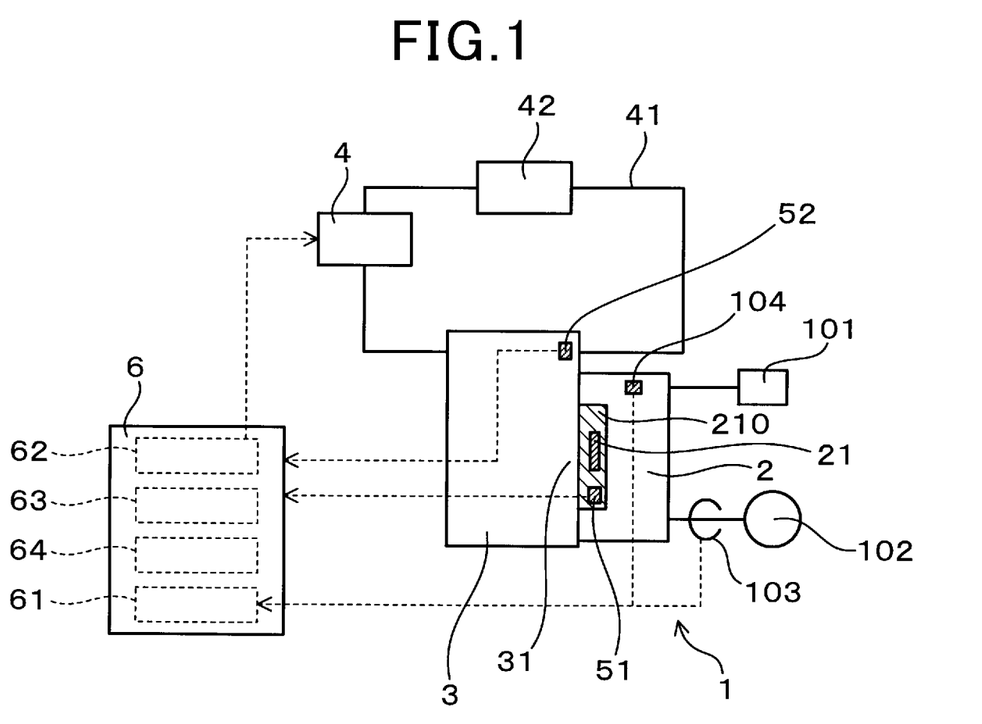
FIG. 1 is a configuration conceptual diagram of a cooling device in a first embodiment.

As illustrated in FIG. 1, the cooling device 1 in the present embodiment has a cooler 3, a circulator 4, a semiconductor temperature detection unit 51, a refrigerant temperature detection unit 52, an output acquisition unit 61, and a flow velocity control unit 62.

A liquid refrigerant for cooling a power semiconductor element 21 of a power converter (2) is circulatable in the cooler 3. The circulator 4 circulates the refrigerant in the cooler 3. The semiconductor temperature detection unit 51 detects the temperature of the power semiconductor element 21.

The refrigerant temperature detection unit 52 detects the temperature of the refrigerant upstream of a heat receiving portion 31. The heat receiving portion 31 here is an inner portion of the cooler 3 that receives heat from the power semiconductor element 21. More specifically, the heat receiving portion 31 is an inner portion where the power semiconductor element 21 thermally contacts the cooler 3. Upstream of the heat receiving portion 31, the refrigerant exchanges heat with the power semiconductor element 21. That is, the refrigerant temperature detection unit 52 detects the temperature of the refrigerant before heat exchange with the power semiconductor element 21. Thus, in the present embodiment, the refrigerant temperature detection unit 52 is provided near a refrigerant inlet of the cooler 3.

The output acquisition unit 61 acquires a value of the output of the power converter 2. The output here refers to output power. In the following description, the output means output power unless otherwise specified. The flow velocity control unit 62 controls the flow velocity of the refrigerant in the cooler 3 based on a detected semiconductor temperature that is the temperature of the semiconductor element detected by the semiconductor temperature detection unit 51, the detected refrigerant temperature that is the temperature of the part of the refrigerant detected by the refrigerant temperature detection unit 52, and a value of the output of the power converter acquired by the output acquisition unit 61.

Figure 3:
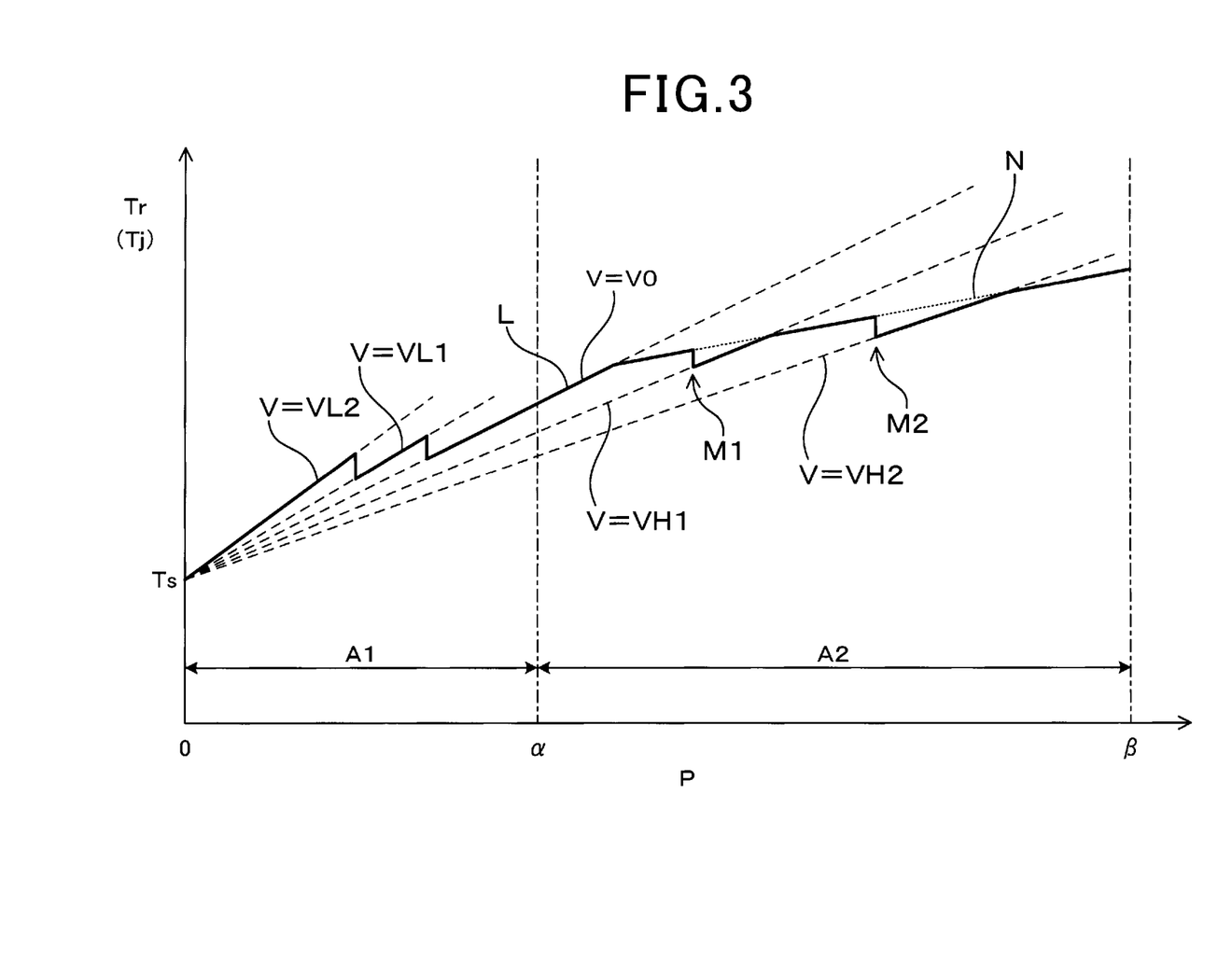
FIG. 3 is a diagram describing a relationship between a value of the output of the power converter and temperature of a power semiconductor element, which is controlled by the cooling device in the first embodiment.

As illustrated in FIG. 3, the output area of the power converter 2 is divided into a first output area A1 where a value of the output is equal to and smaller than a predetermined threshold α and a second output area A2 where a value of the output exceeds the predetermined threshold α. The flow velocity control unit 62 performs the following control in the first output area A1 and the second output area A2. That is, in the first output area A1, the flow velocity control unit 62 controls the flow velocity of the refrigerant within a range where the refrigerant in the heat receiving portion 31 is in a non-boiling state. In the second output area A2, the flow velocity control unit 62 controls the flow velocity of the refrigerant within a range where the refrigerant in the heat receiving portion 31 is in either the non-boiling state or a nucleate boiling state. The flow velocity of the refrigerant in the second output area A2 is set to be equal to or greater than an upper limit value V0 of the flow velocity of the refrigerant in the first output area A1.

FIG. 3 illustrates a relationship between a value of the output P of the power converter 2 and a temperature Tr of the power semiconductor element 21 cooled by the cooler 3. An almost saw-tooth-shaped solid line L indicates an example of changes in the temperature Tr of the power semiconductor element 21 due to the value of the output P. The reference sign Ts indicates the temperature of the refrigerant before heat exchange with the power semiconductor element 21. That is, the refrigerant temperature detected by the refrigerant temperature detection unit 52 is Ts.

Five half lines extending to the upper right from a point where P=0, Tr=Ts in different angular directions indicate changes in the temperature of the power semiconductor element 21 undergoing liquid phase cooling by the refrigerant flowing at specific respective flow velocities V. In other words, the five lines are extensions of line segments indicating a relationship between the power semiconductor element 21 undergoing liquid phase cooling and the output P. These half lines are shown by broken lines except for portions overlapping the solid line L.

The half lines with reference signs "V=VL2", "V=VL1", "V=V0", "V=VH1", and "V=VH2" respectively indicate the temperatures of the power semiconductor element 21 undergoing liquid phase cooling where the flow velocities V are VL2, VL1, V0, VH1, and VH2. In this case, VL2<VL1 V0<VH1<VH2.

A straight line N indicates the temperature of the power semiconductor element 21 cooled by the refrigerant in the nucleate boiling state. The straight line N is shown by a fine broken line except for the portions overlapping the solid line L.

Figure 2:
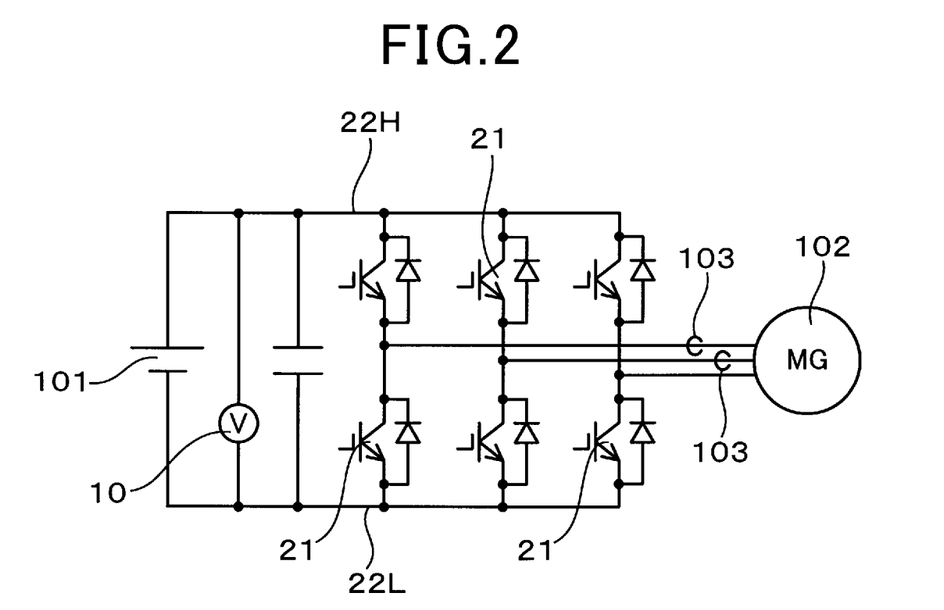
FIG. 2 is a circuit diagram of a power converter in the first embodiment.

The power converter 2 cooled by the cooling device 1 of the present embodiment can be a power converter for vehicle that is mounted in an electric automobile, hybrid automobile, or the like, for example. In this case, as illustrated in FIGS. 1 and 2, the power converter 2 is connected between a direct-current power source 101 and an alternating-current rotary electric machine 102 to perform power conversion between them.

The power converter 2 includes a plurality of power semiconductor elements 21. FIG. 1 is a schematic diagram illustrating only one power semiconductor element 21. The power converter is configured to perform power conversion between direct-current power and alternating-current power by switching operations of the plurality of power semiconductor elements 21. Therefore, the power semiconductor elements 21 generate heat along with activation of the power converter 2. Thus, the cooling device 1 is configured to cool the power semiconductor elements 21.

According to the value of the output of the power converter 2, current flowing into the power semiconductor element 21 changes, and the loss, that is, the amount of heat generation also changes. Therefore, as described above, according to the output of the power converter 2, that is, according to the divided first output area A1 and second output area A2, the flow velocity control unit 62 sets a method for controlling the flow velocity of the refrigerant.

The cooler 3 is provided in thermal contact with the power semiconductor elements 21. The power semiconductor elements 21 are built in a semiconductor module 210 integrated with diodes, terminals, heat radiation members, and others. The semiconductor module 210 and the cooler 3 may be in direct contact with each other or may be in contact with each other with a thermally-conductive member therebetween. The liquid refrigerant is circulatable in the cooler 3. In the present embodiment, the refrigerant is water. However, the refrigerant is not limited to water but may be another liquid refrigerant. Examples of refrigerants other than water include ammonia, water mixed with ethylene glycol-based antifreeze, carbon fluoride-based refrigerants such as Fluorinert, CFC-based refrigerants such as HCFC123 and HFC134a, alcohol-based refrigerants such as methanol and alcohol, ketone-based refrigerants such as acetone.

The refrigerant having been introduced into the cooler 3 passes through the inside of the cooler 3, and exchanges heat with the power semiconductor element 21 in the heat receiving portion 31 of the cooler 3, and then is discharged from the cooler 3. The refrigerant having received the heat from the power semiconductor element 21 and been discharged from the cooler 3 circulates in a circulation path 41 illustrated in FIG. 1. Then, the refrigerant radiates heat by air cooling in a heat radiation unit 42 provided in the circulation path 41. After having reached a low temperature again, the refrigerant is returned into the cooler 3. This circulation of the refrigerant is performed by the circulator 4. The circulator 4 is a circulation pump, for example. The circulator 4 is configured to be capable of adjusting the circulation speed of the refrigerant. That is, the circulator 4 can adjust the flow velocity of the refrigerant in the heat receiving portion 31 of the cooler 3. The flow velocity control unit 62 is configured to control the output of the circulator 4.

The first output area A1 is a steady output area where the power converter 2 operates continuously. The second output area A2 is a non-steady output area where the power converter 2 operates temporarily with high output exceeding steady output.

The power converter 2 drives the rotary electric machine 102 within the rated output during steady running of the vehicle, for example. Meanwhile, at the time of sudden starting, sudden acceleration, sudden deceleration, or the like, the power converter 2 may temporarily drive the rotary electric machine 102 with output exceeding the rated output. The value of the rated output constitutes the predetermined threshold α that is the upper limit in the first output area A1. That is, an area where the value of the output equal to and smaller than the value of the rated output constitutes the first output area A1, and an area where the value of the output exceeding the value of the rated output constitutes the second output area A2.

Even if the rotary electric machine 102 is driven in the second output area A2, that is, with a value of the output exceeding a value of the rated output, the value of the output will not exceed an instantaneous maximum output value that is a preset upper limit value. That is, an upper limit value β in the second output area A2 is also predetermined as a maximum output value of the power converter 2. The upper limit value β can be about 1.2 to 5 times the threshold α, for example.

The first output area A1 can be continuously maintained, and the second output area A2 can be maintained only for a short time such as several seconds to several tens of seconds, for example. Normally, the operation in the first output area A1 is performed, and the operation in the second output area A2 is performed only temporarily. Therefore, the proportion of the operating time in the second output area A2 to the total operating time is extremely low. If the thermal design of the cooling device is made in accordance with such a slight proportion of the second output area A2, the cooling performance will become excessive most of the time. That is, cooling energy will be excessively consumed. Thus, the cooling device 1 controls the flow velocity of the refrigerant flowing into the cooler 3 in the divided regions, that is, the first output area A1 and the second output area A2.

Next, one specific example of flow velocity control of the refrigerant in the cooling device 1 of the present embodiment will be described with reference to the control flowchart in FIG. 4.

During operation of the power converter 2, in step S1, the semiconductor temperature detection unit 51 detects the temperature Tr of the power semiconductor element 21. In step S2, the output acquisition unit 61 acquires the value of the output P of the power converter 2. In the present embodiment, as illustrated in FIGS. 1 and 2, there is provided an ammeter 103 in output wiring from the power converter 2 to the rotary electric machine 102. The power converter 2 has a voltmeter 104 that detects a voltage applied between high-potential wiring 22H and low-potential wiring 22L.

The output acquisition unit 61 calculates the value of the output P of the power converter 2 based on the current value measured by the ammeter 103 and the voltage value measured by the voltmeter 104. The output acquisition unit 61 and the flow velocity control unit 62 are provided in a control device 6 together with a temperature estimation unit 63 and a boiling state determination unit 64 described later.

In step S3, an estimated semiconductor temperature Tj is calculated. The estimated semiconductor temperature Tj refers to the temperature of the power semiconductor elements 21 on the assumption that liquid phase cooling is performed in the second output area A2. The estimated semiconductor temperature Tj is calculated by the temperature estimation unit 63 based on a set flow velocity V of the refrigerant set by the flow velocity control unit 62, the detected refrigerant temperature Ts, and the acquired a value of the output P.

More specifically, the estimated semiconductor temperature Tj is calculated by the following equation:

$$Tj[\square] = Ts[\square] + Rth[\square/W] \times W[W]$$

In the foregoing equation, Rth represents a thermal resistance between the power semiconductor element 21 and the refrigerant at the set flow velocity V. The thermal resistance Rth refers to a measurement value of thermal resistance measured in advance at each set flow velocity V or a calculation value of thermal resistance calculated by a derivation formula according to the set flow velocity V, for example.

In addition, W represents the loss of the power semiconductor element 21 in a value of the output power P. The loss W refers to a loss value of the power semiconductor element 21 derived from the voltage value detected by the voltmeter 104 and the current value detected by the ammeter 103 with each acquired value of the output P. The loss W can be a loss value derived from a map obtained by pre-measurement or a loss value calculated from a loss derivation formula.

The estimated semiconductor temperature Tj is represented by half lines V=V0, V=VH1, and V=VH2 illustrated in FIG. 3, for example. Of these half lines, in particular, the portions shown by broken lines above the solid line L indicate the estimated temperatures of the power semiconductor element 21 that would be reached if liquid phase cooling is performed without a shift to the nucleate boiling state at the respective flow velocities.

Figure 4:
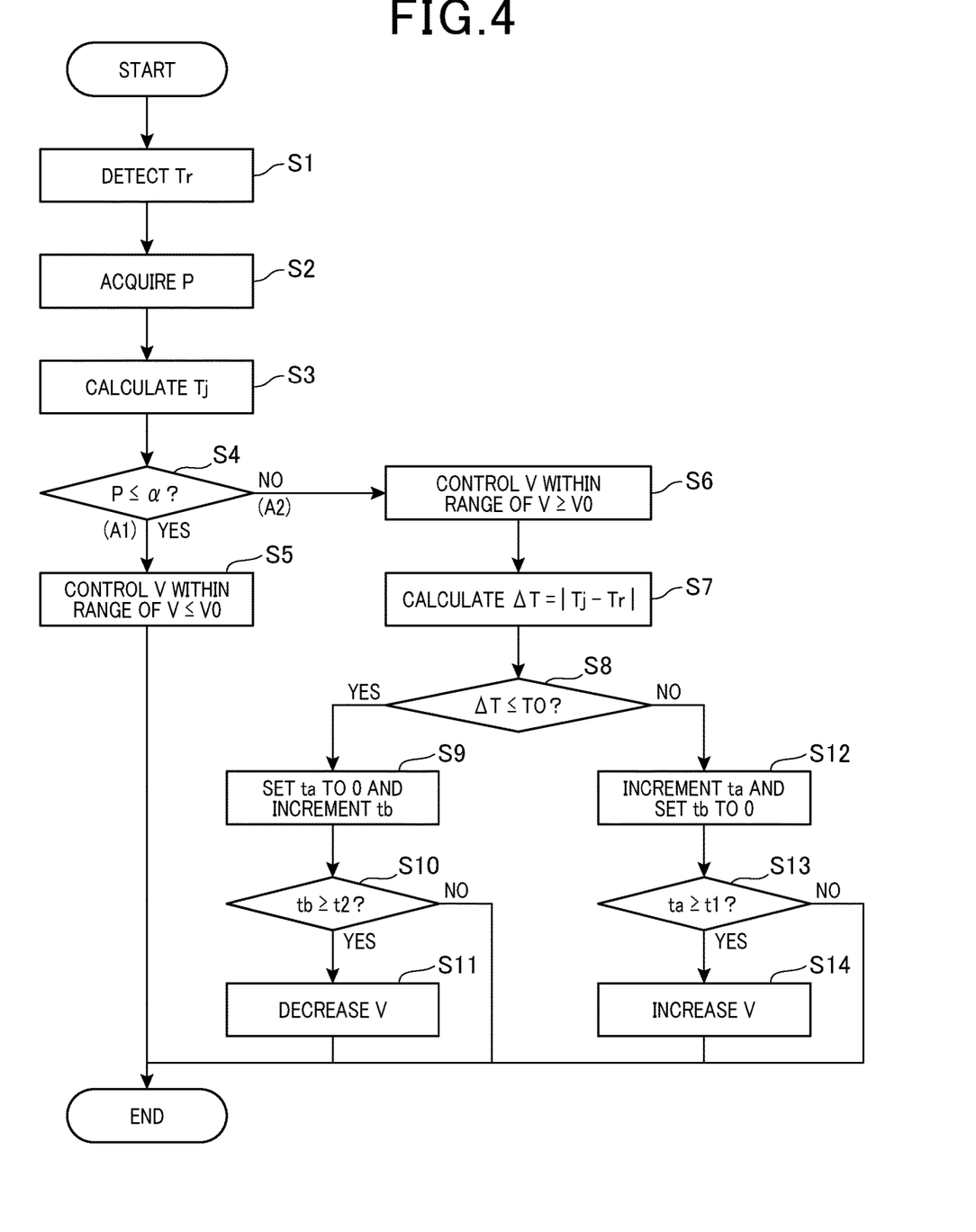
FIG. 4 is a control flowchart of a flow velocity control unit in the first embodiment.

Then, in step S4 illustrated in FIG. 4, the value of the output P is compared to the threshold α. Specifically, it is determined whether the output P of the power converter 2 is in the first output area A1 or the second output area A2. When it is determined that P≤α, that is, that the output P is in the first output area A1, the flow velocity V of the refrigerant is set as appropriate within the range of V≤V0 in step S5. Then, the circulator 4 is controlled according to the set value of the flow velocity V. In this case, the flow velocity V of the refrigerant is set as appropriate within the range of V0 and smaller while liquid phase cooling is maintained. At this time, as illustrated in FIG. 3, the flow velocity V can be adjusted according to the magnitude of the output P.

On the other hand, in step S4 illustrated in FIG. 4, when it is determined that P>α, that is, the output P is in the second output area A2, the flow velocity V of the refrigerant is set as appropriate within the range of V≥V0 in step S6 and the subsequent steps. The flow velocity V within the range of V≥V0 is first decided according to the determination on the boiling state of the refrigerant by the boiling state determination unit 64. That is, in step S7, a difference ΔT between the estimated semiconductor temperature Tj and the detected semiconductor temperature Tr is calculated. Based on the difference ΔT, the boiling state determination unit 64 determines whether the refrigerant in the heat receiving portion 31 of the cooler 3 is in the non-boiling state or the nucleate boiling state. Specifically, it is determined whether the refrigerant is in the non-boiling state or the nucleate boiling state depending on whether the difference ΔT is equal to or smaller than a predetermined threshold T0. This determination is performed in step S8.

When determining in step S8 that ΔT≤T0, the boiling state determination unit 64 determines that the refrigerant is in the non-boiling state. That is, when the refrigerant in the heat receiving portion 31 is in the non-boiling state, the actual temperature of the power semiconductor element 21 theoretically coincides with the estimated semiconductor temperature Tj. This is because the estimated semiconductor temperature Tj is estimated as the temperature of the power semiconductor element 21 on the assumption that liquid phase cooling is performed as described above. In actuality, however, the detected semiconductor temperature Tr as the detected temperature of the power semiconductor element 21 may have a slight error from the actual temperature of the power semiconductor element 21, and the calculated estimated semiconductor temperature Tj may also be erroneous due to errors in the individual values for use in the calculation. Therefore, even in the non-boiling state, Tj and Tr may not completely coincide with each other. In the non-boiling state, however, the difference ΔT between Tj and Tr is within the range allowing for the errors described above. Thus, when the difference ΔT is equal to or smaller than the predetermined threshold T0, the refrigerant in the heat receiving portion 31 can be estimated to be in the non-boiling state.

In this manner, when determining in step S8 that ΔT≤T0, the boiling state determination unit 64 determines that the refrigerant is in the non-boiling state. In this case, in step S9, a count to of duration of the nucleate boiling state is initialized to zero and a count tb of duration of the non-boiling state is incremented. After that, in step S10, it is determined whether the count tb is equal to or greater than a threshold t2. In the case of tb≥t2, in step S11, the flow velocity V of the refrigerant is decreased. However, the state V≥V0 is maintained. The decrease width of the flow velocity V is set in advance, for example, and the set width is decreased. The flow velocity is decreased from V=VH2 to V=VH1 or from V=VH1 to V=V0, for example. This decrease of the flow velocity V corresponds to upward movement of stepped portions M1 and M2 of the solid line L illustrated in FIG. 3.

Decreasing the flow velocity V is to shift the non-boiling state to the nuclear boiling state in the second output area A2 when the non-boiling state has continued for at least predetermined time.

That is, preventing the continuance of the liquid phase cooling and effectively using boiling cooling in the second output area A2 improves the efficiency of cooling the power semiconductor elements 21. On the other hand, when it is determined in step S10 that tb<t2, the flow velocity V of the refrigerant is left unchanged.

On the other hand, when determining in step S8 illustrated in FIG. 4 that ΔT>T0, the boiling state determination unit 64 determines that the refrigerant is in the nucleate boiling state. That is, when the refrigerant in the heat receiving portion 31 is in the nucleate boiling state, the power semiconductor elements 21 are likely to be cooled as compared to the case of liquid phase cooling. That is, heat flux is larger in the nucleate boiling region than in the non-boiling region. Thus, when the power semiconductor elements 21 exchange heat with the refrigerant in the nucleate boiling region, the temperature decreases much more than in the case where the power semiconductor elements 21 exchange heat with the refrigerant in the non-boiling region. As a result, the detected semiconductor temperature Tr is lower than the estimated semiconductor temperature Tj, and $\Delta T$ becomes larger. Therefore, when the difference $\Delta T$ exceeds the predetermined threshold T0, it can be determined that the refrigerant in the heat receiving portion 31 is in the nucleate boiling state.

Then, in step S12, the count ta of the duration of the nucleate boiling state is incremented and the count tb of the duration of the non-boiling state is initialized to zero. After that, in step S13, it is determined whether the count ta is equal to or greater than a threshold t1. That is, it is determined whether the nucleate boiling state has lasted for a predetermined time (that is, t1). In the case of ta≥t1, the flow velocity V of the refrigerant is increased in step S14. The increase width of the flow velocity V is set in advance, for example, and the set width is increased. The flow velocity is increased from V=V0 to V=VH1 or from V=VH1 to V=VH2, for example. The increase of the flow velocity V corresponds to downward movement of the stepped portions M1 and M2 of the solid line L illustrated in FIG. 3.

On the other hand, when it is determined in step S13 that ta<t1, the flow velocity V of the refrigerant is left unchanged, thereby to maintain the nucleate boiling state.

This control flow is repeated on a periodic basis to set the appropriate flow velocity V of the refrigerant in sequence, and the circulator 4 is controlled such that the refrigerant can flow at the set value of the flow velocity. Accordingly, the power semiconductor elements 21 can be efficiently cooled.

Next, operations and effects of the present embodiment will be described.

In the cooling device 1, the flow velocity control unit 62 controls the flow amount of the refrigerant, dividing the output area of the power converter 2 into the first output area A1 and the second output area A2 as described above. That is, the flow velocity control unit 62 controls the flow velocity, dividing the output area into the first output area A1 where the amount of heat generation in the power semiconductor elements 21 is relatively small and the second output area A2 where the amount of heat generation in the power semiconductor elements 21 is relatively large. Accordingly, the power semiconductor elements 21 can be cooled by liquid phase cooling under simple control in the first output area A1, and can be efficiently cooled by the effective use of boiling cooling in the second output area A2.

The flow velocity of the refrigerant in the second output area A2 is set to be equal to or greater than the upper limit value V0 of the flow velocity of the refrigerant in the first output area A1. This allows sufficient cooling of the power semiconductor elements 21 in the second output area A2 without excessive cooling performance in the first output area A1.

In the second output area A2, the flow velocity control unit 62 controls the flow velocity V of the refrigerant within the range where the refrigerant is in the non-boiling state or the nucleate boiling state. This makes it possible to use boiling cooling in the nucleate boiling region where heat flux from the power semiconductor elements 21 to the refrigerant tends to be large in the second output area A2.

Furthermore, even if the refrigerant has boiled, the refrigerant is in the nucleate boiling state and is circulated by the circulator 4, and it is thus easy to maintain a sub-cooled boiling state. In that state, the air bubbles generated by boiling maintained in a state where they are cooled and burst from the periphery by the refrigerant flowing in the cooler 3. Therefore, there is no need to provide a condenser, and the device can be downsized and simplified.

The foregoing matter will be further described with reference to a boiling curve illustrated in FIG. 5.

It is known that the boiling states of the refrigerant include nucleate boiling state, transition boiling state, and film boiling state that are different from each other according to the degree of superheating. The graph of the boiling curve in FIG. 5 is a double logarithmic graph in which the horizontal axis indicates a logarithm of degree of superheating log $\Delta T_{sat}$ and the vertical axis indicates a logarithm of heat flux log q. A boiling curve B indicates changes in the heat flux of the refrigerant from a non-boiling region b0 to a film boiling region b3. As described above, the degree of superheating refers to the difference between the temperature of surface of heat transfer to the refrigerant and the saturation temperature of the refrigerant. The heat flux is an index of cooling performance.

Figure 5:
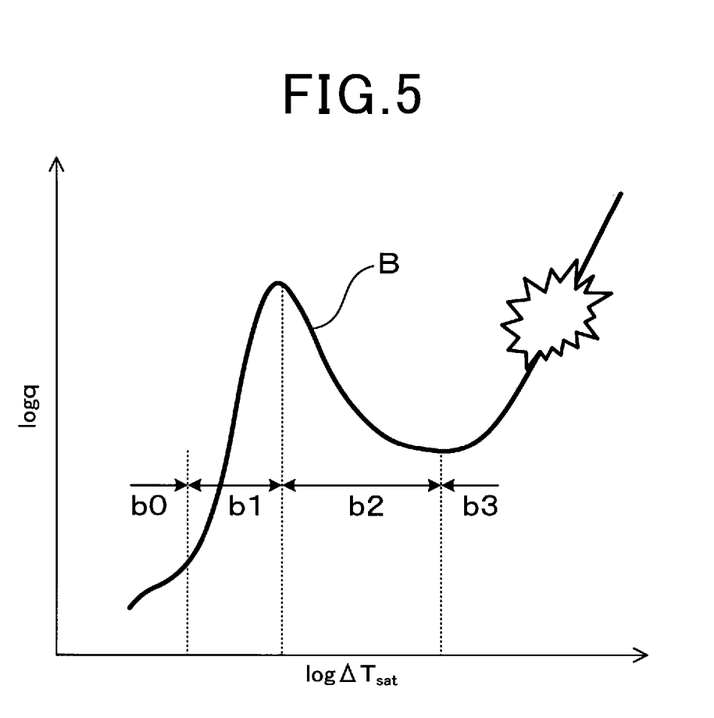
FIG. 5 is a diagram describing a boiling curve.

As can be seen from FIG. 5, the heat flux is small in the non-boiling region b0. That is, the cooling efficiency is relatively low in the liquid phase cooling state. In contrast to this, the heat flux rapidly becomes high in the nucleate boiling region b1. That is, in the nucleate boiling region b1, the so-called boiling cooling state is obtained, and the cooling efficiency becomes high.

When the degree of superheating becomes high and the refrigerant shifts to the transition boiling region b2, the heat flux gradually becomes smaller. Then, when the degree of superheating further becomes high and the refrigerant shifts to the film boiling region b3, the heat flux rises again. In the film boiling state, however, bubbles in the refrigerant connect together into a film shape on the heat transfer surface, and the gas film blocks the heat radiation path from the heat transfer surface to the refrigerant liquid. As a result, the temperature of the power semiconductor element 21 may sharply become high. Therefore, in the case of using boiling cooling in the second output area A2, the nucleate boiling region is used to prevent a shift to the transition boiling region or the film boiling region.

On the other hand, when the flow velocity of the refrigerant is increased too much in the second output area A2, the liquid phase cooling is continued and thus the cooling efficiency cannot be raised. Therefore, the effective use of the nucleate boiling region can be achieved by preventing the flow velocity from becoming too high.

However, when the boiling of the refrigerant is continued too much, the refrigerant may become deteriorated. That is, when the boiling is continued too much, the composition of the refrigerant may change or some component of the refrigerant may become separated as solid matter from the refrigerant, for example. As a result, the cooling performance may become affected. Therefore, when the nucleate boiling state of the refrigerant in the heat receiving portion 31 lasts for a predetermined time (that is, t1) in the second output area A2, the flow velocity control unit 62 increases the flow velocity of the refrigerant to cause a temporary shift from the nucleate boiling state to the non-boiling state. This prevents the deterioration of the refrigerant.

Meanwhile, continuing the non-boiling state too much in the second output area A2 is disadvantageous in the terms of cooling performance. Therefore, when the non-boiling state of the refrigerant in the heat receiving portion 31 lasts for a predetermined time (that is, t2) in the second output area A2, the flow velocity control unit 62 decreases the flow velocity V of the refrigerant to cause a shift from the non-boiling state to the nucleate boiling state. This makes it possible to ensure the usage of boiling cooling and improve the cooling efficiency.

The cooling device 1 calculates the estimated semiconductor temperature Tj as the temperature of the power semiconductor elements 21 on the assumption that liquid phase cooling is performed in the second output area A2 by the temperature estimation unit 63. This makes it possible to obtain the difference ΔT between the estimated semiconductor temperature Tj and the detected semiconductor temperature Tr, thereby to easily determine the non-boiling state or the nucleate boiling state as described above.

The first output area A1 is an area of steady output where the power converter 2 operates continuously, and the second output area A2 is an area of non-steady output where the power converter 2 operates temporarily with high power exceeding the steady output. Thus, liquid phase cooling is steadily performed while suppressing the flow velocity of the refrigerant. This achieves cooling of the power semiconductor elements 21 under simple control while suppressing the output of the circulator 4. In addition, the appropriate use of boiling cooling in the temporarily occurring second output area A2 enhances the cooling performance.

As described above, according to the present embodiment, it is possible to provide a cooling device that allows downsizing and simplification of the device and achieves easy control and improvement in cooling efficiency.

Second Embodiment

Figure 6:
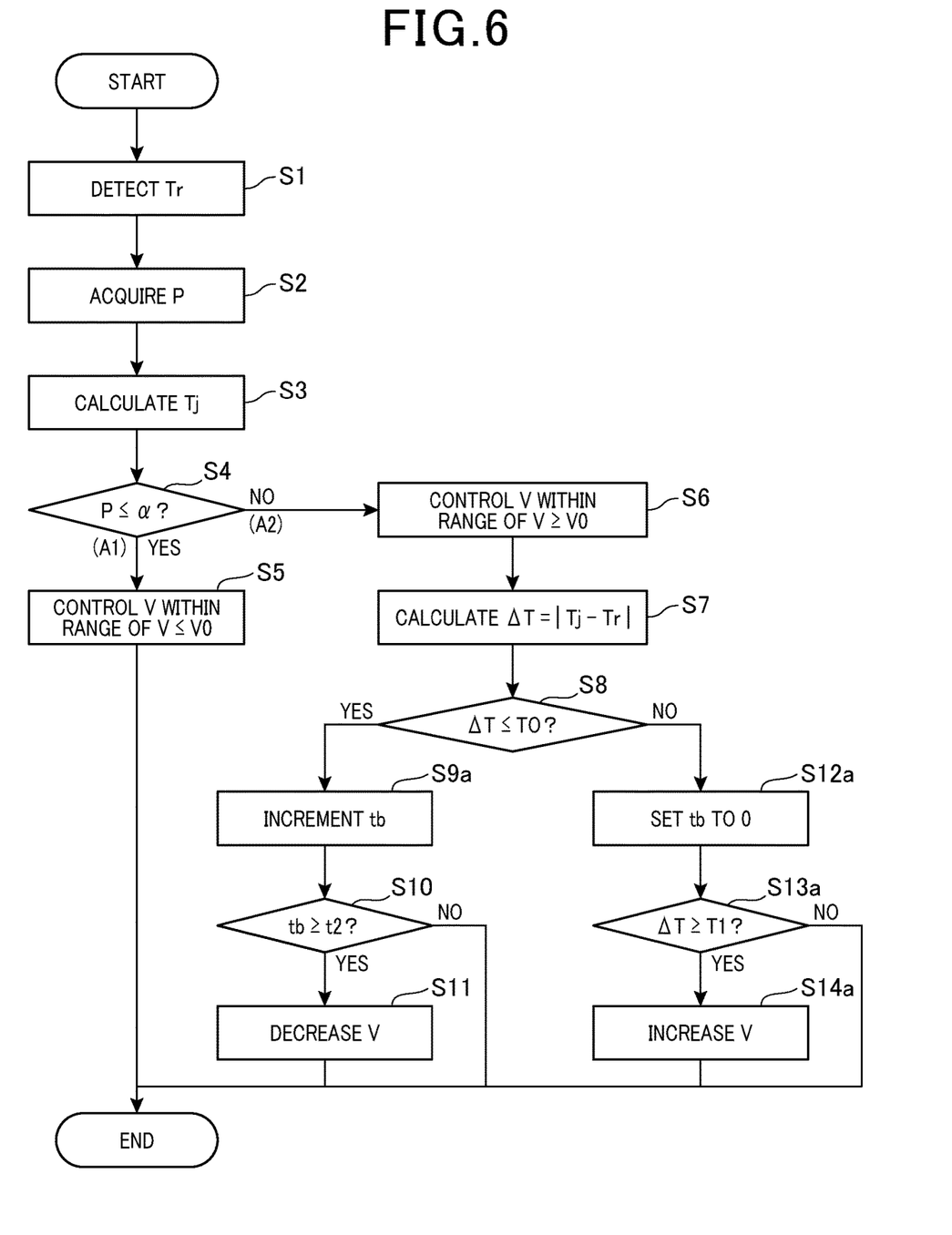
FIG. 6 is a control flowchart of a flow velocity control unit in a second embodiment.

In the cooling device 1 of the present embodiment, as illustrated in FIG. 6, when the difference ΔT between the estimated semiconductor temperature Tj and the detected semiconductor temperature Tr becomes equal to or greater than the predetermined value T1 in the second output area A2, the flow velocity control unit 62 increases the flow velocity V of the refrigerant.

That is, when it is determined that ΔT>T0 in step S8 of the control flow illustrated in FIG. 6, that is, the refrigerant in the heat receiving portion 31 is in the nucleate boiling state, the process flow is as described below. First, in step S12a, a count tb of duration of the non-boiling state is initialized to zero. Then, in step S13a, the difference ΔT is compared to a predetermined threshold T1. The threshold T1 is larger than the threshold T0. The threshold T1 may vary depending on the flow velocity V at that time. That is, the threshold T1 may be a predetermined value according to each flow velocity V.

When it is determined that ΔT≥T1 in step S13a, the flow velocity V of the refrigerant is increased in step S14a. That is, when the difference ΔT becomes too large, the refrigerant may become deteriorated. That is, when the difference ΔT becomes too large, the boiling state may be more likely to continue, thereby facilitating deterioration of the refrigerant. Thus, when the difference ΔT reaches the predetermined threshold T1, the flow velocity V is increased to cause a shift to liquid phase cooling. On the other hand, when it is determined that ΔT<T1 in step S13a, the flow velocity V of the refrigerant is left unchanged.

In the control by the cooling device 1 of the present embodiment, the count ta of the duration of the nucleate boiling state used in the control by the cooling device 1 of the first embodiment is not used. Accordingly, there is no initialization or increase of the count ta in steps S9a and S12a of the process flow of the present embodiment illustrated in FIG. 6, unlike in steps S9 and 12 of the process flow of the first embodiment illustrated in FIG. 4. In the present embodiment, however, the flow velocity V can also be controlled taking into consideration the count ta of the duration of the nucleate boiling state. That is, for example, the flow velocity V of the refrigerant can be increased when the relationship ΔT≥T1 or ta≥t1 holds.

In other respects, the second embodiment is configured in the same manner as the first embodiment. Out of the reference signs used in the second and subsequent embodiments, the same reference signs as those used in the embodiment already described indicate the same constituent elements as those in the embodiment already described unless otherwise specified.

In the present embodiment, when the difference ΔT becomes equal to or greater than the predetermined value T1, the flow velocity control unit 62 increases the flow velocity V of the refrigerant. This makes it possible to appropriately control the flow velocity V of the refrigerant even in the case where the output P of the power converter 2 changes in a short time. That is, it is possible to make flow velocity changes of the refrigerant more responsive to output fluctuations of the power converter 2. As a result, it is possible to suppress thermal shock due to the sharp temperature change of the power semiconductor element 21 in a large output range of the output P. In addition, it is easier to suppress the deterioration of the refrigerant.

In other respects, the second embodiment produces the same operations and effects as those of the first embodiment.

In the embodiments described above, the flow velocity V of the refrigerant is changed stepwise. Alternatively, the flow velocity control unit can continuously change the flow velocity of the refrigerant.

The present disclosure is not limited to the foregoing embodiments but is applicable to various embodiments without deviating from the gist of the present disclosure.

The present disclosure has been described so far according to the embodiments, but it is noted that the present disclosure is not limited to the foregoing embodiments or structures. The present disclosure includes various modifications and changes in a range of equivalency. In addition, various combinations and modes, and other combinations and modes including only one element of the foregoing combinations and modes, less or more than the one element are included in the scope and conceptual range of the present disclosure.

What is claimed is:

1. A cooling device comprising:
    a cooler in which a liquid refrigerant for cooling a power semiconductor element of a power converter is circulatable, the cooler including a heat receiving portion that receives heat from the power semiconductor element;
    a circulator that circulates the refrigerant in the cooler;
    a semiconductor temperature detection unit that detects a temperature of the power semiconductor element;
    a refrigerant temperature detection unit that detects a temperature of a part of the refrigerant, the part of the refrigerant flowing upstream of the heat receiving portion;
    an output acquisition unit that acquires an output of the power converter; and
    a flow velocity control unit that controls a flow velocity of the refrigerant in the cooler based on a detected semiconductor temperature that is the temperature of the semiconductor element detected by the semiconductor temperature detection unit, a detected refrigerant temperature that is the temperature of the part of the refrigerant detected by the refrigerant temperature detection unit, and a value of the output of the power converter acquired by the output acquisition unit, wherein when an output area of the power converter is divided into a first output area equal to and lower than a predetermined threshold and a second output area exceeding the threshold, the flow velocity control unit is configured to:
- control, in the first output area, the flow velocity of the refrigerant to be maintained within a range where the refrigerant in the heat receiving portion is kept in a non-boiling state; and
- control, in the second output area, the flow velocity of the refrigerant to be maintained within a range where the refrigerant in the heat receiving portion is in the non-boiling state or a nucleate boiling state, the flow velocity of the refrigerant in the second output area being equal to or greater than an upper limit value of the flow velocity of the refrigerant in the first output area.

2. The cooling device according to claim 1, wherein:
the first output area is an area of steady output where the power converter operates continuously, and the second output area is an area of non-steady output where the power converter operates temporarily with high output exceeding the steady output.

3. The cooling device according to claim 1, wherein:
the flow velocity control unit is configured to increase, in the second output area, the flow velocity of the refrigerant upon the nuclear boiling state of the refrigerant having continued for a predetermined time.

4. The cooling device according to claim 1, wherein:
the flow velocity control unit is configured to decrease, in the second output area, the flow velocity of the refrigerant upon the non-boiling state of the refrigerant having continued for a prescribed time.

5. The cooling device according to claim 1, comprising:
a temperature estimation unit configured to, upon liquid phase cooling being performed in the second output area, calculate an estimated semiconductor temperature as the temperature of the power semiconductor element based on a value of the flow velocity of the refrigerant set by the flow velocity control unit, the detected refrigerant temperature, and the value of the output of the power converter; and
a boiling state determination unit that determines whether the refrigerant in the heat receiving portion is in the nucleate boiling state or the non-boiling state based on a difference between the estimated semiconductor temperature and the detected semiconductor temperature.

6. The cooling device according to claim 5, wherein:
the flow velocity control unit is configured to increase, in the second output area, the flow velocity of the refrigerant upon the difference between the estimated semiconductor temperature and the detected semiconductor temperature being equal to or greater than a predetermined value.

* * * * *